United States Patent
Matsura (10) Patent No.: US 12,526,918 B2
(45) Date of Patent: Jan. 13, 2026

(54) WIRING SUBSTRATE AND METHOD FOR MANUFACTURING WIRING SUBSTRATE

(71) Applicant: Niterra Co., Ltd., Nagoya (JP)

(72) Inventor: Jyunya Matsura, Nagoya (JP)

(73) Assignee: NITERRA CO., LTD., Nagoya (JP)

( * ) Notice: Subject to any disclaimer, the term of this patent is extended or adjusted under 35 U.S.C. 154(b) by 202 days.

(21) Appl. No.: 18/458,472

(22) Filed: Aug. 30, 2023

(65) Prior Publication Data

US 2024/0080974 A1    Mar. 7, 2024

(30) Foreign Application Priority Data

Sep. 2, 2022   (JP) ................................ 2022-140095
Jul. 21, 2023   (JP) ................................ 2023-119137

(51) Int. Cl.
| | |
|---|---|
| H05K 1/16 | (2006.01) |
| H01C 7/00 | (2006.01) |
| H01C 17/242 | (2006.01) |
| H05K 1/03 | (2006.01) |
| H05K 3/46 | (2006.01) |

(52) U.S. Cl.
CPC .......... *H05K 1/0306* (2013.01); *H01C 7/006* (2013.01); *H01C 17/242* (2013.01); *H05K 1/167* (2013.01); *H05K 3/46* (2013.01); *H05K 2201/0317* (2013.01)

(58) Field of Classification Search
CPC ........ H05K 1/167; H05K 1/0306; H05K 3/46; H05K 2201/0317
See application file for complete search history.

(56) References Cited

U.S. PATENT DOCUMENTS

| | | | |
|---|---|---|---|
| 6,225,570 B1 * | 5/2001 | Ishiyama | H05K 1/167 361/762 |
| 2011/0269319 A1 * | 11/2011 | Cheng | H05K 3/365 439/67 |

FOREIGN PATENT DOCUMENTS

| | | |
|---|---|---|
| JP | 60-143691 A | 7/1985 |
| JP | 2020-64999 A | 4/2020 |

* cited by examiner

*Primary Examiner* — Jeremy C Norris
(74) *Attorney, Agent, or Firm* — Stites & Harbison, PLLC; Jeffrey A. Haeberlin (57) ABSTRACT

A wiring substrate includes a ceramic substrate, a thin-film resistor disposed on the ceramic substrate, a first resin layer formed of a resin and disposed in a region on the ceramic substrate where the resistor is not disposed, and a second resin layer formed of a resin and covering the resistor on the ceramic substrate.

3 Claims, 11 Drawing Sheets

WIRING SUBSTRATE AND METHOD FOR MANUFACTURING WIRING SUBSTRATE

CROSS REFERENCE TO RELATED APPLICATIONS

This patent application claims priority from Japanese Patent Application No. 2022-140095 filed with the Japanese Patent Office on Sep. 2, 2022 and Japanese Patent Application No. 2023-119137 filed with the Japanese Patent Office on Jul. 21, 2023. The entire contents of Japanese Patent Application No. 2022-140095 and Japanese Patent Application No. 2023-119137 are incorporated by reference in this application.

BACKGROUND OF THE INVENTION

Field of the Invention

The present invention relates to a wiring substrate and to a method for manufacturing a wiring substrate.

Description of the Related Art

There has been known a wiring substrate having a thin-film resistor trimmed to adjust its resistance (see, for example, JP2020-064999A). In the wiring substrate disclosed in JP2020-064999A, a resistor is formed on a surface of a ceramic substrate and is covered with a resin substrate.

In order to render the resistance of a resistor more accurate, laser trimming must be performed for the resistor. If, after adjustment of the resistance of the resistor by means of trimming, a resin layer is disposed on the resistor and a ceramic substrate and heat and pressure are applied so as to join the resin layer to the ceramic substrate, the resistance of the resistor changes. Meanwhile, if a resin layer is formed before trimming of the resistor and an attempt is made to perform laser trimming from above the resin layer, adjustment of the resistance is difficult because the resistor cannot be viewed directly.

SUMMARY OF THE INVENTION

The present invention has been accomplished so as to solve, at least partially, the above-described problem. An object of the present invention is to increase the accuracy of the resistance of a resistor which is incorporated into a wiring substrate and whose surface is covered with a resin layer.

The present invention can be realized in the following mode.

(1) According to one mode of the present invention, a wiring substrate is provided. This wiring substrate comprises a ceramic substrate, a thin-film resistor disposed on the ceramic substrate, a first resin layer formed of a resin and disposed in a region on the ceramic substrate where the resistor is not disposed, and a second resin layer formed of a resin and covering the resistor on the ceramic substrate.

In this configuration, two resin layers are present on the ceramic substrate; i.e., the first resin layer disposed in a region where the resistor is not disposed, and the second resin layer which covers the resistor. By virtue of this configuration, it is possible to adjust the resistance of the resistor and form the second resin layer to cover the resistor, after joining the first resin layer and the ceramic substrate through application of heat and pressure to the first resin layer. Since application of heat and pressure for joining the first resin layer to the ceramic substrate can be performed before adjustment of the resistance of the resistor as described above, the temperature of heat applied at the time of formation of the second resin layer can be made lower than that at the time of joining the first resin layer and the ceramic substrate. Moreover, the number of times of heating and the heating time at the time of formation of the second resin layer can be reduced as compared with those at the time of joining the first resin layer and the ceramic substrate. Namely, a thermal change which is applied to the resistor at the time of formation of the second resin layer can be made smaller than that at the time of joining the first resin layer and the ceramic substrate. Namely, since the thermal change applied to the resistor is suppressed, the resistance of the resistor can be adjusted accurately. Also, since the resistor is covered with the second resin layer, it is possible to protect the resistor from influences of chemical solution, oxidation, etc. As a result, in the wiring substrate having a structure in which the surface of the resistor is covered with a resin layer (the second resin layer), the accuracy of the resistance of the resistor can be increased.

(2) The wiring substrate of the above-described mode may be configured such that the first resin layer has a first surface facing the ceramic substrate, a second surface located on a side opposite the first surface, and a through hole which extends between the first surface and the second surface, the resistor is disposed on the ceramic substrate to be located in the through hole of the first resin layer, and the second resin layer fills the through hole of the first resin layer.

In this configuration, the first resin layer on the ceramic substrate has a shape for surrounding the resistor disposed in the through hole. By virtue of this configuration, it is possible to form the wiring substrate by joining the first resin layer and the ceramic substrate in a state in which the resistor whose resistance has not yet been adjusted is disposed on the ceramic substrate, subsequently, adjusting the resistance of the resistor, and forming the second resin layer to fill the through hole. As a result, the wiring substrate having a structure in which the surface of the resistor is covered with a resin layer (the second resin layer) can be formed simply.

(3) The wiring substrate of the above-described mode may be configured such that the second resin layer is composed of a plurality of layers, and the resistor is disposed between the plurality of layers of the second resin layer.

By virtue of this configuration, the position of the resistor in the thickness direction is adjusted by adjusting the thicknesses of the plurality of layers which constitute the second resin layer.

(4) According to another mode of the present invention, a method for manufacturing a wiring substrate is provided. This manufacturing method comprises a disposing step of disposing a thin-film resistor on a ceramic substrate, a joining step of joining a resin sheet onto the ceramic substrate, the resin sheet being formed of a resin and having a through hole extending therethrough in its thickness direction, in such a manner that the resistor is disposed in the through hole, an adjusting step of adjusting a resistance of the resistor by means of laser trimming, and a filling step of filling the through hole with a liquid resin.

According to this method, in the joining step, the resin sheet is joined onto the ceramic substrate in such a manner that the resistor disposed on the ceramic substrate is disposed in the through hole of the resin sheet. Subsequently, the resistance of the resistor disposed in the through hole is adjusted by means of laser trimming, a liquid resin is supplied to the through hole to fill the through hole. As a result, it is possible to prevent application to the resistor of heat and pressure, applied when the resin sheet is joined onto the ceramic substrate. In addition, the temperature of heat and the number of times of application of heat for formation of the resin layer from the liquid resin are reduced as compared with those at the time of joining the resin sheet. Thus, a thermal change applied to the resistor having undergone resistance adjustment is suppressed. Therefore, in the present configuration, it is possible to cover the surface of the resistor with resin and maintain a state in which the resistance of the resistor has been adjusted accurately.

Notably, the present invention can be realized in various modes. For example, the present invention can be realized as a wiring substrate, a semiconductor device, an electronic component, a system including them, or a method for manufacturing the wiring substrate.

DESCRIPTION OF THE PREFERRED EMBODIMENT

Embodiment

Figure 1:
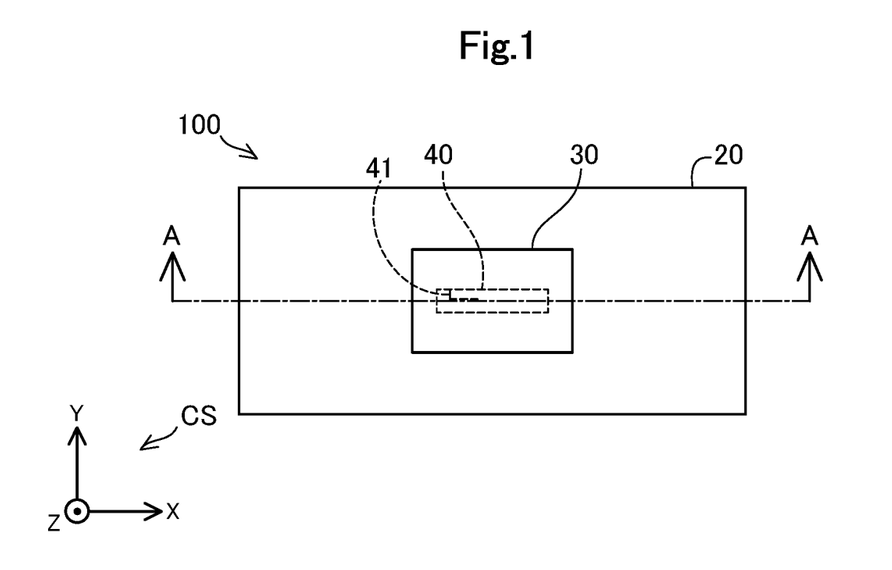
FIG. 1 is an explanatory view of a wiring substrate according to one embodiment of the present invention.
Figure 2:
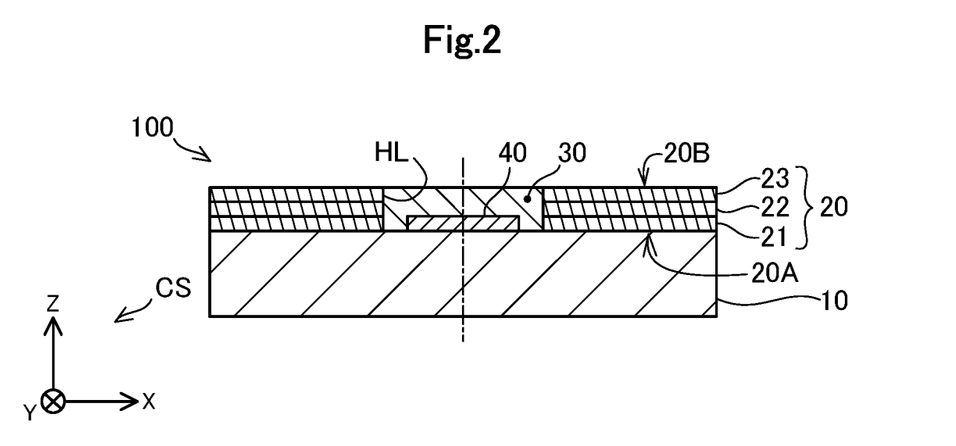
FIG. 2 is an explanatory view of the wiring substrate according to the embodiment of the present invention.

FIGS. 1 and 2 are explanatory views of a wiring substrate 100 according to one embodiment of the present invention. FIG. 1 shows a schematic front view of the wiring substrate 100. FIG. 2 shows a schematic sectional view of the wiring substrate 100 taken along line A-A in FIG. 1. In the present embodiment, a resistor 40 is disposed on a ceramic substrate 10. A resin sheet 20 having a through hole HL extending therethrough in its thickness direction is joined to the ceramic substrate 10 in such a manner that the resistor 40 is disposed in the through hole HL. After joining, the resistance of the resistor 40 is adjusted by means of laser trimming. Subsequently, a liquid resin is supplied to the through hole HL to fill the through hole HL, and the liquid resin is cured.

As shown in FIGS. 1 and 2, the wiring substrate 100 includes the ceramic substrate 10 formed of mainly a ceramic material (main component), the thin-film resistor 40 disposed on the ceramic substrate 10, a resin sheet (first resin layer) 20 disposed on the ceramic substrate 10, and a resin coat (second resin layer) 30 which covers the resistor 40 on the ceramic substrate 10. The wiring substrate 100 of the present embodiment is a substrate containing at least one resistor 40. Notably, the term "main component" used in the present embodiment refers to a component which is contained in an amount of 90 mass % or more.

The ceramic substrate 10 has a predetermined thickness and a rectangular shape. In the present embodiment, a Cartesian coordinate system CS shown in FIGS. 1 and 2 is employed. In the Cartesian coordinate system CS, an axis parallel to the thickness direction of the ceramic substrate 10 is defined as a Z-axis, and axes which are orthogonal to the Z-axis and are parallel to the longer and shorter sides, respectively, of the ceramic substrate 10 are defined as an X-axis and a Y-axis, respectively. The Cartesian coordinate system CS corresponds to the Cartesian coordinate systems CS shown in FIGS. 4 to 9 and 11.

As shown in FIG. 2, the resin sheet 20 has a first surface 20A which is located on a Z-axis negative direction side and faces the ceramic substrate 10 and a second surface 20B which is located on a side opposite the first surface 20A; i.e., on a Z-axis positive direction side. The through hole HL extends between the first surface 20A and the second surface 20B. As shown in FIG. 1, the through hole HL of the present embodiment is a rectangular hole having sides parallel to the X-axis and sides parallel to the Y-axis.

The resin sheet 20 of the present embodiment includes a first sheet 21, a second sheet 22, and a third sheet 23 each of which is formed of a resin. As shown in FIG. 2, the first sheet 21, the second sheet 22, and the third sheet 23 are stacked in this order from the ceramic substrate 10 side. Preferably, each of the sheets 21 to 23 is formed of mainly a resin (main component) which does not melt when a metal member is brazed to the wiring substrate 100 (namely, whose melting point is higher than that of brazing filler metal or solder). A preferred example of such a resin is polyimide, which is also excellent in chemical resistance. The resin sheet 20 is joined to the ceramic substrate 10 by fusion bonding of a heat fusion layer (not shown) provided on the first surface 20A.

Although not shown in FIG. 2, in the present embodiment, wiring layers each having a predetermined wiring pattern are respectively disposed between the ceramic substrate 10 and the first sheet 21, between the first sheet 21 and the second sheet 22, and between the second sheet 22 and the third sheet 23. Examples of a material used to form the wiring layers include W, Mo, Mn, Cu, Ag, and alloys of these metals.

As shown in FIGS. 1 and 2, the resistor 40 is disposed on the ceramic substrate 10 in such a manner that the resistor 40 is located in the through hole HL of the resin sheet 20. In other word, the resin sheet 20 is disposed in a region on the ceramic substrate 10 where the resistor 40 is not disposed. The resistor 40 is formed to have a certain size, and the planar shape (namely, area) of the resistor 40 is adjusted by means of laser trimming such that the resistor 40 has a desired resistance. The resistor 40 has a thickness of a few thousands of angstroms. For example, TaN (tantalum nitride) is preferably used as a material of the resistor 40.

As shown in FIG. 2, the resin coat 30 is disposed to fill the through hole HL of the resin sheet 20. In the present embodiment, the resin coat 30 is formed as a result of curing of a liquid resin which is supplied to the through hole HL to fill the through hole HL after the resin sheet 20 has been joined to the ceramic substrate 10. Consequently, the resin coat 30 is disposed to cover the resistor 40 on the ceramic substrate 10. In the present embodiment, the resin coat 30 is formed of polyimide. However, the resin coat 30 may be formed of any of other known resins.

Figure 3:
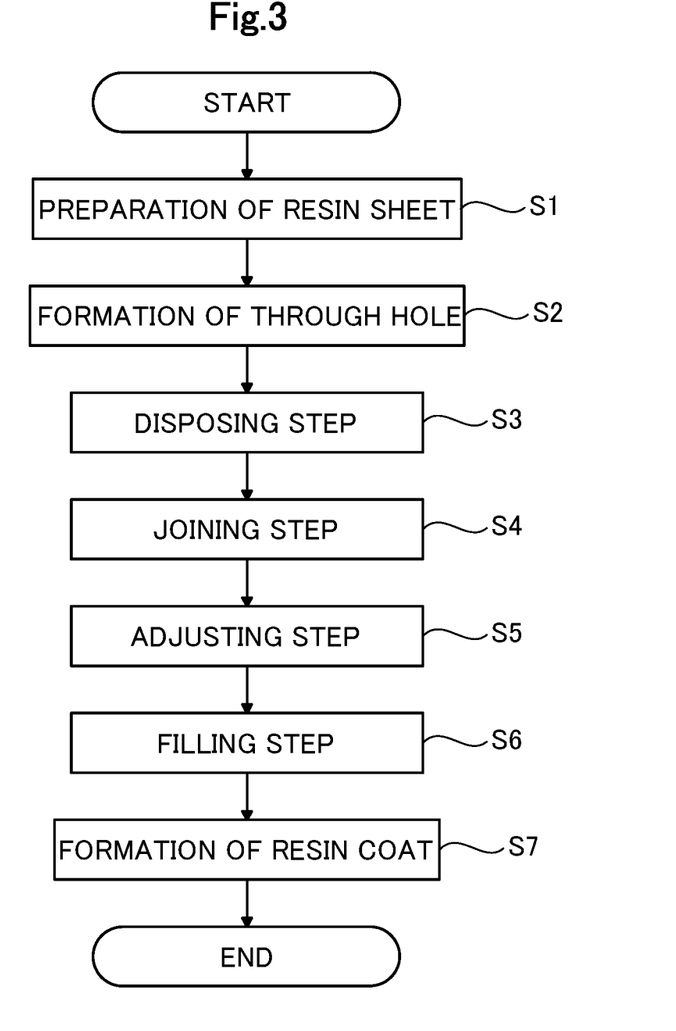
FIG. 3 is a flowchart showing a method for manufacturing the wiring substrate of the present embodiment.
Figure 4:
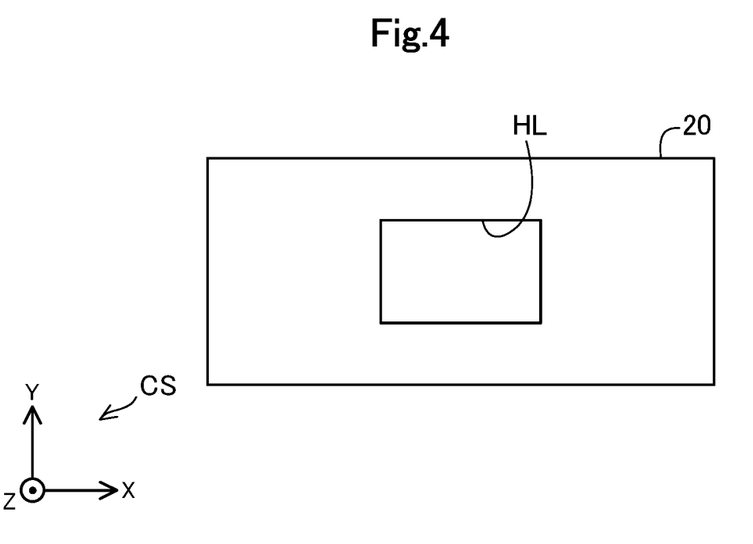
FIG. 4 is a schematic front view of a resin sheet having a through hole formed therein.

FIG. 3 is a flowchart showing a method for manufacturing the wiring substrate 100 of the present embodiment. In the manufacturing process shown in FIG. 3, firstly, a resin sheet 20 including stacked three layers; i.e., the first sheet 21, the second sheet 22, and the third sheet 23, is prepared (step S1). Wiring layers are disposed between the sheets 21 to 23. Subsequently, a through hole HL is formed in the prepared resin sheet 20 such that the through hole HL extends therethrough in the thickness direction (step S2). FIG. 4 is a schematic front view of the resin sheet 20 having the through hole HL formed therein. As shown in FIG. 4, in the present embodiment, the through hole HL, which has a rectangular shape, is formed in a central region of the resin sheet 20.

Figure 5:
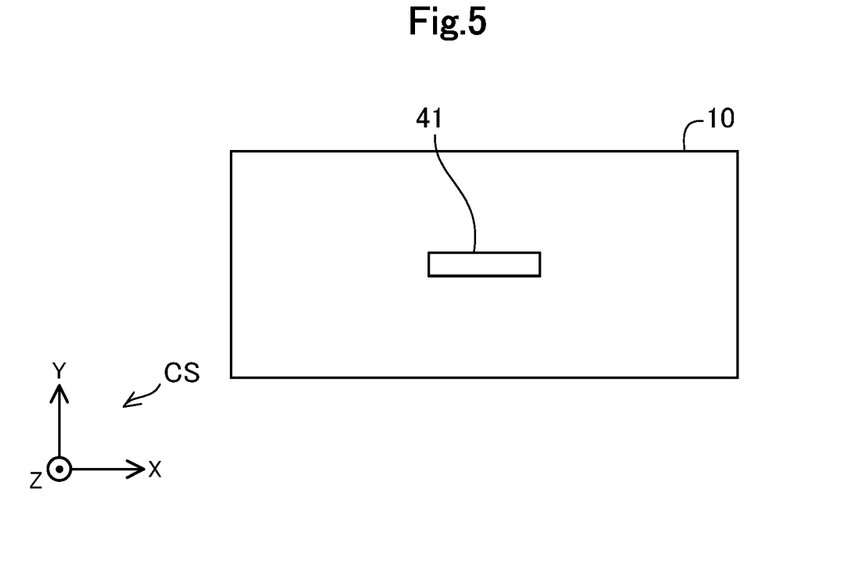
FIG. 5 is a schematic front view of a ceramic substrate at the time of a disposing step.

After formation of the through hole HL in the resin sheet 20, a disposing step of disposing a resistor 40 on a prepared ceramic substrate 10 is performed (step S3 of FIG. 3). The ceramic substrate 10 on which the resistor 40 is disposed is an unfired ceramic green sheet. FIG. 5 is a schematic front view of the ceramic substrate 10 at the time of the disposing step. As shown in FIG. 5, in the present embodiment, the resistor 40 is disposed in a central region on the surface of the ceramic substrate 10 on the Z-axis positive direction side.

Figure 6:
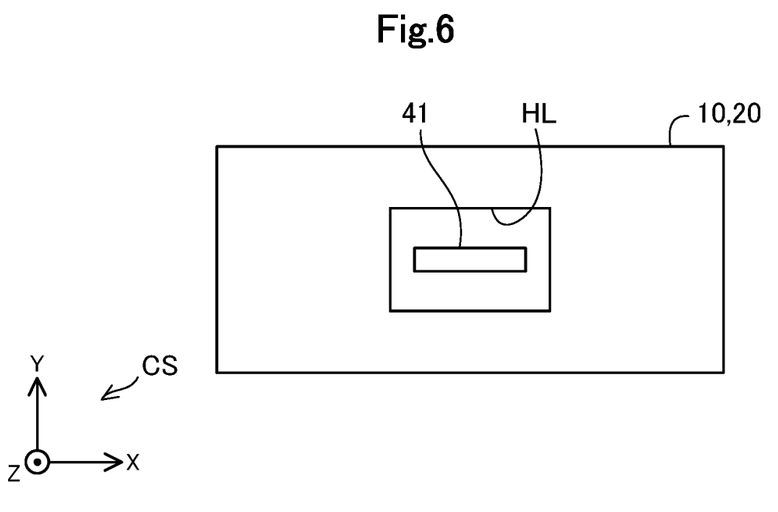
FIG. 6 is a schematic front view of the ceramic substrate and the resin sheet at the time of a joining step.

After completion of the disposing step, a joining step of joining the resin sheet 20 onto the ceramic substrate 10 is performed (step S4 of FIG. 3). FIG. 6 is a schematic front view of the ceramic substrate 10 and the resin sheet 20 at the time of the joining step. As shown in FIG. 6, in the joining step, the resin sheet 20 is joined to the ceramic substrate 10 in such a manner that the resistor 40 is disposed in the through hole HL of the resin sheet 20. After being disposed in such a manner that the first surface 20A of the resin sheet 20 faces the ceramic substrate 10, the resin sheet 20 is joined to the ceramic substrate 10, by fusion bonding of the heat fusion layer, as a result of application of heat and pressure.

Figure 7:
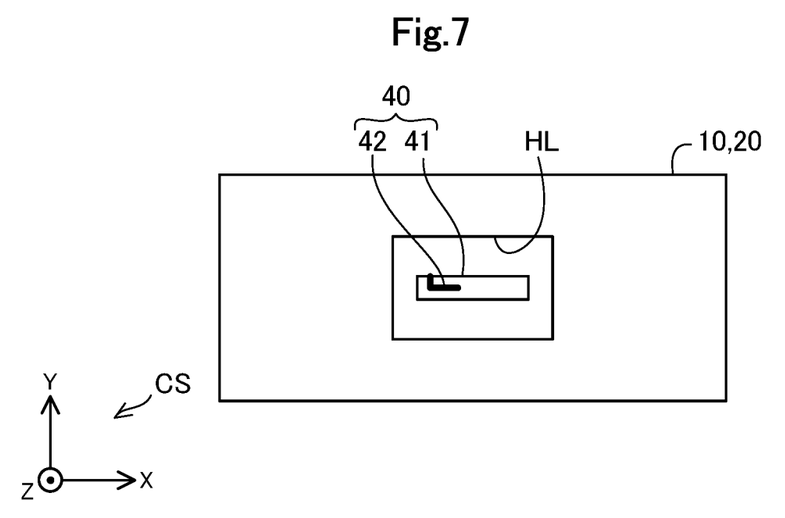
FIG. 7 is a schematic front view of the ceramic substrate and the resin sheet after an adjusting step.

After completion of the joining step, an adjustment step of adjusting the resistance of the resistor 40 by means of laser trimming is performed (step S5 of FIG. 3). FIG. 7 is a schematic front view of the ceramic substrate 10 and the resin sheet 20 after the adjusting step. In the present embodiment, a cutout 42 is formed in a main body portion 41 of the resistor 40 by means of laser trimming, whereby the area of the resistor 40 is adjusted. As a result, the resistance of the resistor 40 is adjusted.

Figure 8:
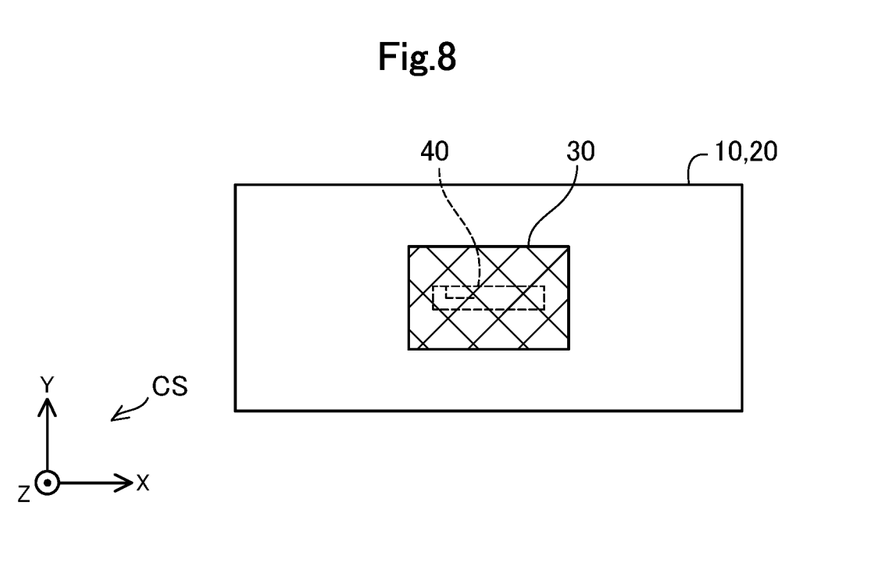
FIG. 8 is a schematic front view of the ceramic substrate and the resin sheet after a filling step.

After completion of the adjusting step, a filling step of filling the through hole HL with a liquid resin is performed (step S6 of FIG. 3). FIG. 8 is a schematic front view of the ceramic substrate 10 and the resin sheet 20 after the filling step. In FIG. 8, the liquid resin which fills the through hole HL is hatched. The liquid resin is supplied to fill the through hole HL in such a manner that the liquid resin has the same thickness as the resin sheet 20 in the thickness direction (the Z-axis direction). In other words, the height of the liquid resin from the ceramic substrate 10 (reference) is the same as the thickness of the resin sheet 20.

After completion of the filling step, the liquid resin which fills the through hole HL is irradiated with ultraviolet rays, whereby a cured resin coat 30 is formed (step S7 of FIG. 3). Thus, the process of manufacturing the wiring substrate 100 ends. As a result of formation of the resin coat 30, the resistor 40 disposed on the ceramic substrate 10 is covered with the cured resin coat 30.

Figure 9:
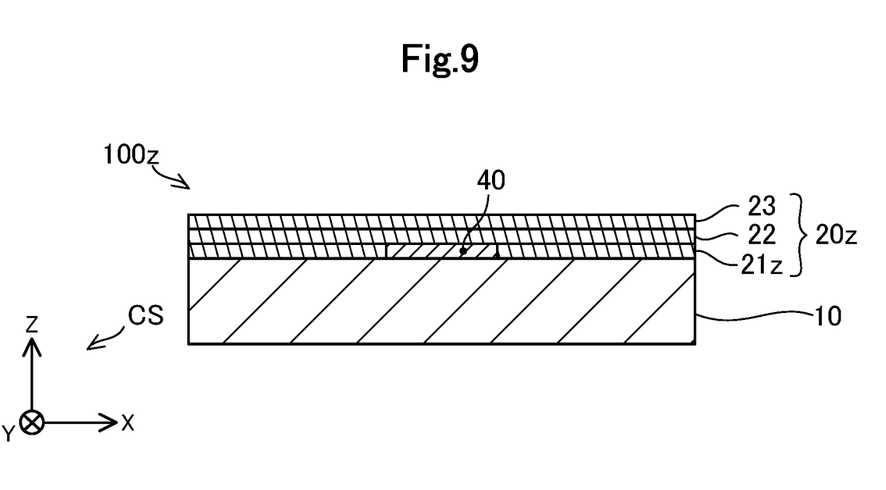
FIG. 9 is a schematic sectional view of a wiring substrate of a comparative example.

FIG. 9 is a schematic sectional view of a wiring substrate 100z of a comparative example. In the wiring substrate 100z of the comparative example, unlike the wiring substrate 100 of the above-described embodiment shown in FIGS. 1 and 2, the resin coat 30 is not provided, and the resistor 40 is covered with a resin sheet 20z. As shown in FIG. 9, the resin sheet 20z in the comparative example is a sheet composed of a first sheet 21z, a second sheet 22, and a third sheet 23 each of which is formed of a resin and which are stacked together. In the comparative example, since the resistor 40 is disposed between the ceramic substrate 10 and the resin sheet 20z, the resistor 40 is influenced by heat and pressure applied when the resin sheet 20z is joined to the ceramic substrate 10.

Figure 10:
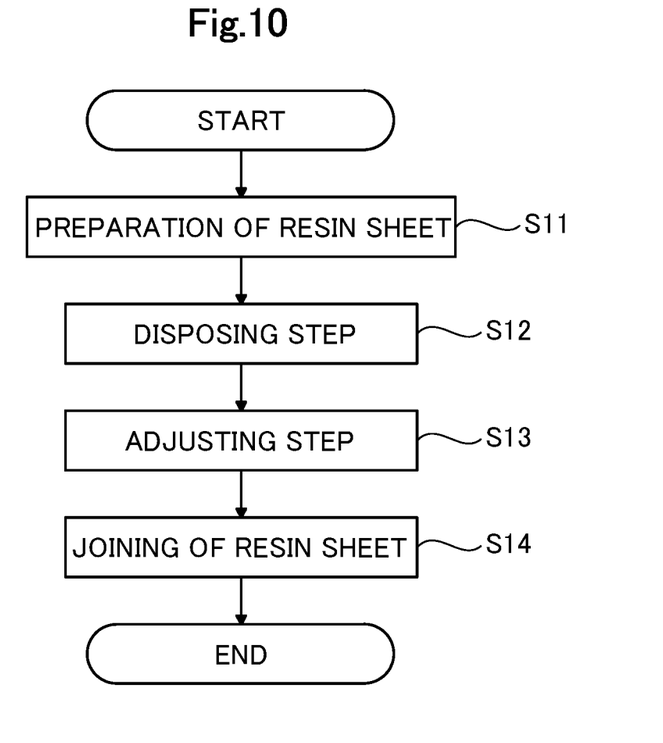
FIG. 10 is a flowchart showing a method for manufacturing the wiring substrate of the comparative example.

FIG. 10 is a flowchart showing a method for manufacturing the wiring substrate 100z of the comparative example. In the manufacturing process shown in FIG. 10, a resin sheet 20z is prepared (step S11) as in the case of the embodiment (step S1 of FIG. 3). Next, a disposing step of disposing a resistor 40 on a prepared ceramic substrate 10 is performed (step S12) as in the case of the embodiment (step S3 of FIG. 3). After completion of the disposing step, an adjusting step of adjusting the resistance of the resistor 40 by means of laser trimming is performed (step S13) as in the case of the embodiment (step S5 of FIG. 3). After completion of the adjusting step, the resin sheet 20z disposed to cover the resistor 40 whose resistance has been adjusted is joined to the ceramic substrate 10 (step S14). Thus, the process of manufacturing the wiring substrate 100z of the comparative example ends.

As having been described above, the wiring substrate 100 of the present embodiment includes the thin-film resistor 40 disposed on the ceramic substrate 10, the resin sheet 20 disposed on the ceramic substrate 10, and the resin coat 30 which covers the resistor 40 on the ceramic substrate 10. The resin sheet 20 is disposed in a region on the ceramic substrate 10 where the resistor 40 is not disposed. The resin coat 30 is disposed to cover the resistor 40 on the ceramic substrate 10. Namely, in the present embodiment, two resin layers are present on the ceramic substrate 10; i.e., the resin sheet 20 disposed in a region where the resistor 40 is not disposed, and the resin coat 30 which covers the resistor 40. By virtue of this configuration, it is possible to adjust the resistance of the resistor 40 and form the resin coat 30 to cover the resistor 40, after joining the resin sheet 20 and the ceramic substrate 10 through application of heat and pressure to the resin sheet 20. Since application of heat and pressure for joining the resin sheet 20 to the ceramic substrate 10 can be performed before adjustment of the resistance of the resistor 40 as described above, the temperature of heat applied at the time of formation of the resin coat 30 can be made lower than that at the time of joining the resin sheet 20 and the ceramic substrate 10. Moreover, the number of times of heating and the heating time at the time of formation of the resin coat 30 can be reduced as compared with those at the time of joining the resin sheet 20 and the ceramic substrate 10. Namely, a thermal change which is applied to the resistor 40 at the time of formation of the resin coat 30 can be made smaller than that at the time of joining the resin sheet 20 and the ceramic substrate 10. Namely, since the thermal change applied to the resistor 40 is suppressed, the resistance of the resistor 40 can be adjusted accurately. Also, since the resistor 40 is covered with the resin coat 30, it is possible to protect the resistor 40 from influences of chemical solution, oxidation, etc. As a result, in the wiring substrate 100 having a structure in which the surface of the resistor 40 is covered with a resin layer (resin coat 30), the accuracy of the resistance of the resistor 40 can be increased.

Also, in the present embodiment, the resin sheet 20 has the through hole HL which extends between the first surface 20A facing the ceramic substrate 10 and the second surface 20B located on the side opposite the first surface 20A. As shown in FIGS. 1 and 2, the resistor 40 is disposed on the ceramic substrate 10 in such a manner that the resistor 40 is located in the through hole HL of the resin sheet 20. As shown in FIG. 2, the resin coat 30 is disposed to fill the through hole HL of the resin sheet 20. Namely, the resin sheet 20 on the ceramic substrate 10 has a shape for surrounding the resistor 40 disposed in the through hole HL. By virtue of this configuration, it is possible to form the wiring substrate 100 by joining the resin sheet 20 and the ceramic substrate 10 in a state in which the resistor 40 whose resistance has not yet been adjusted is disposed on the ceramic substrate 10, subsequently, adjusting the resistance of the resistor 40, and forming the resin coat 30 to fill the through hole HL. As a result, the wiring substrate 100 having a structure in which the surface of the resistor 40 is covered with a resin layer (resin coat 30) can be formed simply.

Also, in the joining step in the method for manufacturing the wiring substrate 100 of the present embodiment, the resin sheet 20 is joined to the ceramic substrate 10 in such a manner that the resistor 40 is disposed in the through hole HL, which extends through the resin sheet 20 in the thickness direction. In the filling step, a liquid resin is supplied to the through hole HL to fill the through hole HL, thereby covering the resistor 40 whose resistance has been adjusted in the adjusting step. In the joining step of the present embodiment, the resin sheet 20 is joined onto the ceramic substrate 10 in such a manner that the resistor 40 disposed on the ceramic substrate 10 is disposed in the through hole HL of the resin sheet 20. Subsequently, the resistance of the resistor 40 disposed in the through hole HL is adjusted by means of laser trimming, a liquid resin is supplied to the through hole HL to fill the through hole HL. As a result, it is possible to prevent application to the resistor 40 of heat and pressure, applied when the resin sheet 20 is joined onto the ceramic substrate 10. In addition, the temperature of heat and the number of times of application of heat for formation of the resin coat 30 from a liquid resin are reduced as compared with those at the time of joining the resin sheet 20. Thus, a thermal change applied to the resistor 40 having undergone resistance adjustment is suppressed. Therefore, in the present embodiment, it is possible to cover the surface of the resistor 40 with the resin coat 30 and maintain a state in which the resistance of the resistor 40 has been adjusted accurately.

Modifications of the Present Embodiment

The present invention is not limited to the above-described embodiment and can be implemented in various forms without departing from the gist of the present invention. For example, the following modifications are possible.
Modification 1:

The wiring substrate 100 of the above-described embodiment is one example, and the structure, etc. of the wiring substrate 100 can be modified so long as the resistor 40 is covered with the resin coat 30 different from the resin sheet 20. The wiring substrate 100 may have a shape other than a rectangular shape, for example, a circular shape or a polygonal shape in an XY plane perpendicular to the thickness direction. Unlike the above-described embodiment, the ceramic substrate 10 may be formed by a plurality of layers. In this case, layers other than a layer on which the resistor 40 is disposed and which is joined to the resin sheet 20 may be layers whose main components is not a ceramic material. The resin sheet 20 may be composed of a single layer, two layers, or four or more layers.

Each of the wiring layers disposed between the sheets 21 to 23, which form the resin sheet 20, is not limited to a wiring layer having a predetermined wiring pattern and may be a solid layer (plane) formed of a simple flat metal. Also, the wiring layers may form vias which extend through, for example, the second sheet 22. The material of the resistor 40 may be other than TaN or any of known materials. The through hole HL of the resin sheet 20 is not required to have a rectangular cross section and may have, for example, a circular cross section. Also, the resin sheet 20 is not required to have a shape for surrounding the resistor 40 in the XY plane perpendicular to the thickness direction. For example, the through hole HL of the resin sheet 20 shown in FIG. 4 may have a shape which is open on the Y-axis positive direction side of the through hole HL. The number of the resistor(s) 40 disposed on the ceramic substrate 10 may be two or more.

Figure 11:
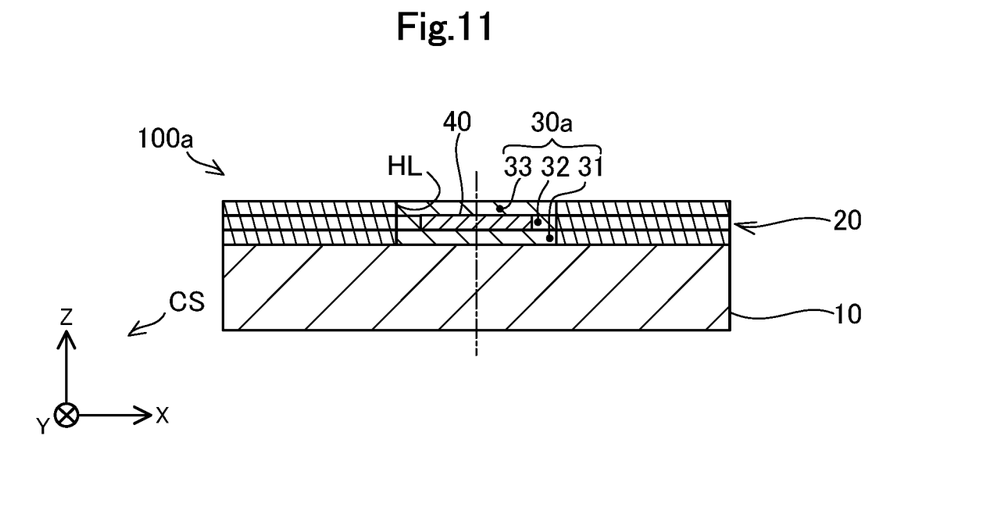
FIG. 11 is a schematic sectional view of a wiring substrate of a modification.

The position of the resistor 40 disposed on the ceramic substrate 10 is not limited to the central region and may be freely chosen within a range where the resistor 40 can be covered with the resin coat 30. In the process of manufacturing the wiring substrate 100 shown in FIG. 3, the disposing step (step S3) of disposing the resistor 40 on the ceramic substrate 10 may be performed after the joining step (step S4) of joining the resin sheet 20 to the ceramic substrate 10.
Modification 2:

FIG. 11 is a schematic sectional view of a wiring substrate 100a. A resin coat 30a of the modification shown in FIG. 11 is composed of a plurality of layers 31 to 33. Furthermore, in the resistor 40 is not required to be disposed on the ceramic substrate 10 and may be disposed between the layers 31 and 33 of the resin coat 30a formed in the through hole HL of the resin sheet 20 and composed of the plurality of layers 31 to 33 as shown in FIG. 11. In the case where the resistor 40 is disposed between the layers 31 and 33 of the plurality of layers 31 to 33 which form the resin coat 30a as in the modification shown in FIG. 11, the position of the resistor 40 in the thickness direction is adjusted by adjusting the thicknesses of the plurality of layers 31 to 33.

The wiring substrate 100a shown in FIG. 11 is manufactured by forming one layer 31 of the resin coat 30a in the through hole HL before performing the disposing step (step S3) of the manufacturing process (FIG. 3) of the above-described embodiment. After formation of the layer 31, the layers 32 and 33 are formed. Notably, of the three layers 31 to 33 which form the resin coat 30a, two layers 32 and 33 may be formed as a single layer.

Although the present invention has been described on the basis of its embodiment and modifications, the above-described embodiment is provided so as to facilitate the understanding of the present invention and does not limit the present invention. The present invention can be changed or improved without departing from the purpose and the scope of the claims, and encompasses equivalents thereof. Also, the technical feature(s) may be eliminated unless the present specification mentions that the technical feature(s) is essential.

The present invention can be implemented as the following modes.

Application Example 1

A wiring substrate comprising:
a ceramic substrate;
a thin-film resistor disposed on the ceramic substrate;
a first resin layer formed of a resin and disposed in a region on the ceramic substrate where the resistor is not disposed; and
a second resin layer formed of a resin and covering the resistor on the ceramic substrate.

Application Example 2

A wiring substrate described in Application example 1, wherein the first resin layer has a first surface facing the ceramic substrate, a second surface located on a side opposite the first surface, and a through hole which extends between the first surface and the second surface,
the resistor is disposed on the ceramic substrate to be located in the through hole of the first resin layer, and
the second resin layer fills the through hole of the first resin layer.

Application Example 3

A wiring substrate described in Application example 1 or 2, wherein
the second resin layer is composed of a plurality of layers, and
the resistor is disposed between the plurality of layers of the second resin layer.

Application Example 4

A method for manufacturing a wiring substrate, comprising:
a disposing step of disposing a thin-film resistor on a ceramic substrate;
a joining step of joining a resin sheet onto the ceramic substrate, the resin sheet being formed of a resin and having a through hole extending therethrough in its thickness direction, in such a manner that the resistor is disposed in the through hole;
an adjusting step of adjusting a resistance of the resistor by means of laser trimming; and
a filling step of filling the through hole with a liquid resin.

What is claimed is:

1. A wiring substrate comprising:
a ceramic substrate;
a thin-film resistor disposed in a region on the ceramic substrate;
a first resin layer formed of a resin and disposed in another region on the ceramic substrate where the resistor is not disposed; and
a second resin layer formed of a resin and composed of a plurality of layers, the resistor disposed between the plurality of layers of the second resin layer.

2. A wiring substrate according to claim 1, wherein the first resin layer has a first surface facing the ceramic substrate, a second surface located on a side opposite the first surface, and a through hole which extends between the first surface and the second surface,
the resistor is disposed in the region on the ceramic substrate to be located in the through hole of the first resin layer, and
the second resin layer fills the through hole of the first resin layer.

3. A method for manufacturing a wiring substrate, comprising:
a joining step of joining a resin sheet onto a ceramic substrate, the resin sheet being formed of a resin and having a through hole extending therethrough in its thickness direction;
a first forming step of forming one layer of a plurality of layers of a second resin layer in the through hole;
a disposing step of disposing a thin-film resistor on the one layer of the second resin layer, such that the resistor is disposed in the through hole;
an adjusting step of adjusting a resistance of the resistor by means of laser trimming; and
a second forming step of forming another layer of the plurality of layers of the second resin layer in the through hole, the resistor disposed between the plurality of layers of the second resin layer, the second resin layer filling the through hole.

* * * * *